(12) United States Patent
Colas et al.

(10) Patent No.: US 8,313,194 B2
(45) Date of Patent: *Nov. 20, 2012

(54) METHOD FOR SELECTING BASE-CURVES FOR AN OPHTHALMIC LENS AND RELATED SPECTACLE LENS MANUFACTURING METHOD

(75) Inventors: Pauline Colas, Charenton-le-Pont (FR); Cécile Pietri, Charenton-le-Pont (FR)

(73) Assignee: Essilor International (Compagnie Generale d'Optique), Charenton le Pont (FR)

( * ) Notice: Subject to any disclaimer, the term of this patent is extended or adjusted under 35 U.S.C. 154(b) by 0 days.

This patent is subject to a terminal disclaimer.

(21) Appl. No.: 12/811,086

(22) PCT Filed: Dec. 23, 2008

(86) PCT No.: PCT/EP2008/068263

§ 371 (c)(1), (2), (4) Date: Jun. 28, 2010

(87) PCT Pub. No.: WO2009/065961

PCT Pub. Date: May 28, 2009

(65) Prior Publication Data

US 2010/0283966 A1    Nov. 11, 2010

(30) Foreign Application Priority Data

Dec. 28, 2007 (EP) .................................. 07301755

(51) Int. Cl.
*G02C 7/02* (2006.01)

(52) U.S. Cl. ................................................ 351/159.73
(58) Field of Classification Search .......... 351/159–177, 351/159.01–159.81
See application file for complete search history.

(56) References Cited

U.S. PATENT DOCUMENTS

| 3,960,442 | A | 6/1976 | Davis et al. |
| 6,948,816 | B2 | 9/2005 | Yamamoto et al. |
| 7,150,527 | B2 | 12/2006 | Meron et al. |
| 7,207,675 | B1 | 4/2007 | Chauveau et al. |
| 2002/0001063 | A1* | 1/2002 | Yanari ............................ 351/169 |
| 2005/0122472 | A1* | 6/2005 | Fisher et al. ................... 351/177 |

FOREIGN PATENT DOCUMENTS

| DE | 101 32 623 | 1/2002 |
| EP | 1 158 337 | 11/2001 |
| EP | 1 752 815 | 2/2007 |
| WO | WO 03/048841 | 6/2003 |

* cited by examiner

*Primary Examiner* — Darryl J Collins
(74) *Attorney, Agent, or Firm* — Cozen 'Connor

(57) ABSTRACT

A method for selecting base-curves for an ophthalmic lens according to given prescription data comprising the steps of: providing a base-curve series consisting of a plurality of base-curves; calculating a target lens according to the prescription data; calculating the base-curves calculated lenses according to the prescription data; selecting, for at least an optical parameter and/or a geometrical parameter, a threshold value for the difference between the base-curves calculated lenses values and the target lens value of said parameter(s); determining the list of the base-curves of the base-curve series where said difference for said parameter(s) is less or equal to the selected threshold value(s).

23 Claims, 4 Drawing Sheets

METHOD FOR SELECTING BASE-CURVES FOR AN OPHTHALMIC LENS AND RELATED SPECTACLE LENS MANUFACTURING METHOD

RELATED APPLICATIONS

This is a U.S. national stage of application No. PCT/EP2008/068263, filed on Dec. 23, 2008.

This application claims the priority of European application no. 07301755.0 filed Dec. 28, 2007, the entire content of which is hereby incorporated by reference.

FIELD OF THE INVENTION

Background of the Invention

The present invention relates to ophthalmic lenses and more specifically to a method for selecting base-curves for an ophthalmic lens for spectacles.

Conventionally, spectacle lenses are manufactured on request in accordance with specifications intrinsic to individual wearers. However lenses are commonly manufactured by using a limited number of semi-finished lens blanks. A semi-finished lens blank has a front face and a rear face.

In the frame of the present invention and according to ISO Standard 13666:1998(E/F) (Ophthalmic optics—Spectacle lenses—Vocabulary), the curvature of the front face is called a "base-curve".

The base-curves are usually expressed referring to a standard refraction index of 1.53, whereas other refraction index may also be used to refer and express base-curves.

The front face of a semi-finished lens blank is usually intended to be the final front surface of the final lens and the other face is machined so as the optical system of the final lens fits the wearer ophthalmic prescriptions. Some minor machining of the front face may occur, but without modifying its curvature.

Semi-finished lens blanks are usually obtained by injection moulding or by casting into moulds. They also can be produced by machining a blank.

Manufacturers typically produce a series of semi-finished lens blanks, each having its own base curve. This "base-curve series" is a system of semi-finished lens blanks that front faces increase incrementally in curvature (e.g., +0.50 D, +2.00 D, +4.00 D, and so on).

The front surface of a semi-finished lens blank of a base-curve series serves as the starting point from which the optical surface of the back surface will be calculated and the final lens be manufactured according to a wearer prescription (or focal power).

The front surfaces of the semi-finished lens blanks of a "base-curve series" may be spheres, aspheric surfaces, progressive addition surfaces.

As for an example, progressive addition lenses (PAL) may be manufactured thanks to semi-finished lens blanks with spherical or aspheric front surfaces and the progressive addition surface is machined to form the rear face of the final lens. They can also be manufactured thanks to semi-finished lens blanks with progressive addition surfaces and the rear face of the blank is machined so as to form a spherical or toric surface. It is also possible to manufacture PAL thanks to semi-finished lens blanks with progressive addition surfaces and to machine the rear face of the lens blank so as to obtain a second progressive addition surface and provide "dual add" PAL.

Each base-curve in a series is conventionally used for producing a range of prescription, as specified by the manufacturer. Manufacturers use base-curve selection charts that provide the recommended prescription ranges for each base-curve in the series. An example of a typical base-curve selection chart is disclosed in patent document U.S. Pat. No. 6,948,816 where the base-curve series of FIGS. 23A to C comprises five base-curves. The selection chart indicates the unique base-curve to be chosen according to a given prescription as a function of the spherical power SPH and of the cylindrical power CYL for curing an astigmatic vision. The disclosed selection chart relates to progressive addition lenses (PAL) in which a power continuously changes between a distance portion and a near portion. The same type of selection chart is widely used for every kind of ophthalmic lenses such as for example single vision lenses (spherical and/or torical), bi-focal lenses, aspherical lens, PAL.

The common trend is to limit the number of base-curves of a base-curve series in order to minimize the mould number, the stocking costs and inventory requirements. A standard base-curve series comprises less or equal to twenty base-curves, as for example equal or less or equal to ten, and preferably five to eight base-curves.

Even though here above standard base-curve selection charts are widely used to manufacture ophthalmic lenses for a given wearer, there remains a need for an improved base-curve selection method.

This is mainly due to increasing needs of customization of spectacle lenses according to optical wearer's preferences or aesthetic criteria.

SUMMARY OF THE INVENTION

One object of the present invention is to enhance the choice panel of base-curves in a given base-curve series without significantly degrading the optical quality according to a given prescription of the final lens.

This object is obtained according to one aspect of the invention directed to a method for selecting base-curves for an ophthalmic lens according to given prescription data comprising the steps of:
- providing a base-curve series consisting of a plurality of base-curves;
- providing, as for example by calculating, a target lens according to the prescription data;
- calculating the base-curves calculated lenses according to the prescription data;
- providing, as for example by selecting, for at least an optical parameter and/or a geometrical parameter, a threshold value for the difference between the base-curves calculated lenses values and the target lens value of said parameter(s);
- determining the list of the base-curves of the base-curve series where said difference for said parameter(s) is less or equal to the selected threshold value(s).

According to an embodiment, the method for selecting base-curves is implemented according to a chosen design.

According to preceding embodiment, the base-curve series and the target lens are provided according to the chosen design.

According to the present invention and thanks to determining a list of possible base-curves for a given prescription, an adequate base-curve can be chosen so as to meet customization criteria.

In the framework of the invention, the following terms have the meanings indicated herein below:

"curvature" of an optical surface is the curvature in a zone or at a specific point of said surface. If the surface is spherical, the curvature is constant and can be determined everywhere. If the surface is a single vision aspheric surface, its curvature is usually measured or determined at the optical center. If the surface is a progressive addition surface, its curvature is usually measured or determined at the distance-vision point. The here above mentioned points are preferred but not limiting points where a curvature according to the present invention can be measured or determined;

a "target lens" has a virtual optical function according to a wearer's prescription and to a chosen design;

a "design" is a widely used wording known from the man skilled in the art to designate the set of parameters allowing to define an optical function of an generic optical system; each ophthalmic lens manufacturer has its own designs, particularly for aspherical lens and for PAL. As for an example, a PAL "design" results of an optimization of the progressive surface so as to restore a presbyope's ability to see clearly at all distances but also to optimally respect all physiological visual functions such as foveal vision, extra-foveal vision, binocular vision and to minimize unwanted astigmatisms. PAL "designs" are tested through rigorous clinical trials before being commercialized;

An "optical parameter" also called "optical characteristics" of a lens is defined as a parameter that has an impact on the visual performance for a wearer, such as data on optical power, astigmatism, aberration, etc., relating to the modifications of a light beam that passes through the lens;

a "geometrical parameter" is defined as a parameter that affects a physical characteristic of the lens, such as thickness data or volume data.

"prescription data" are a set of optical characteristics of optical power, of astigmatism and, where relevant, of addition, determined by an ophthalmologist in order to correct the vision defects of an individual, for example by means of a lens positioned in front of his eye. The term 'astigmatism' is used to denote the data pair formed by an amplitude value and a value of angle. Although this is an abuse of language, it is also sometimes used to denote the amplitude of the astigmatism only. The context allows those skilled in the art to understand which usage of the term is intended. Generally speaking, the prescription data for a progressive lens comprise values of optical power and of astigmatism at the distance-vision point and, where appropriate, an addition value;

"calculating a base-curves calculated lens according to the prescription data" means calculating the optical system of a lens where the front face of the lens is the front surface of the semi-finished lens blank corresponding to said base-curve and the rear face is optimized so as to fit the wearer's prescriptions. Calculating the optical system of a lens with a given front face is known from the man skilled in the art and an example of an accurate method is disclosed in patent document WO 2007/017766.

According to different embodiments that may be combined:
the target lens is calculated with a front face according to Tscherning ellipses;
a selected parameter is an optical parameter chosen in the list comprising dioptric power, total astigmatism, resulting astigmatism;
the method for calculating the difference of a selected parameter value between the base-curves calculated lenses and the target lens is chosen in the list comprising root mean square (RMS) differences, peak to valley (PV) differences, standard deviation, point to point differences;
a selected parameter is an optical parameter determined at a specific point or in a zone of the lens, as for an example a zone around the optical center or the prism reference point (PRP);
the lens is a progressive addition lens and a selected parameter is an optical parameter determined at a location chosen in the list comprising a zone of the far vision zone, a zone of the near vision zone, a zone of the intermediate vision zone, specific points of the far vision zone, near vision zone, intermediate vision zone, meridian line;
the difference of the values of the selected optical parameter is expressed using diopter units and where the threshold value is equal or less to 1 diopter, as for an example less or equal to 0.6 diopter or even less or equal to 0.4 diopter and/or greater to 0.2 diopter;
a selected parameter is a geometrical parameter which is a thickness value at a specific point or in a zone of the lens.

One aspect of the present invention relates to a method for selecting a customized base-curve in the list of base curves provided by the previous method wherein the customized base curve is selected according to a customization criterion.

The Another aspect of the present invention relates to a method for selecting base-curves according to previous embodiments, which further includes a step of selecting a customized base-curve in the list of base-curves, wherein the customized base-curve is selected according to a customization criterion.

According to different embodiments of said method:
the customization criterion is selected in the list comprising thickness value of the final lens, front curvature of the final lens, optical performance of the final lens;
the curvature of the final lens is a customization criterion and is chosen as a function of a spectacle frame chosen by a wearer;
the curvature of the final lens is a customization criterion and is chosen according to a wearer's habits.

The present invention also relates to a method for calculating an optical system (OS) of an ophthalmic lens according to a given prescription comprising the steps of:
selecting a customized base-curve according to preceding method;
providing the front surface of the semi-finished lens blank corresponding to said base-curve as the front surface of the final lens;
calculating the rear surface of the final lens.

According to an embodiment of said method for calculating an optical system (OS) of an ophthalmic lens, the optical system (OS) is identified by a function (OF), the optical system (OS) comprises a first part (F1) corresponding to the front surface of the semi-finished lens blank defined by its equation (EF1) and a second part (F2) defined by a second equation (EF2), and where the method comprises:
a generating step (GEN), in which a virtual optical system (VOS) is used to generate a virtual function (VOF);
a modification step (MOD), in which the virtual function (VOF) is modified so as obtain the function (OF);
a calculation step (CAL), in which the second equation (EF2) is calculated from the function (OF), and the first equation (EF1).

The application WO 2007/017766 teaches how to implement such a method for calculating an optical system (OS) of an ophthalmic lens.

The present invention also relates to a method of manufacturing an ophthalmic lens comprising the steps of:
- calculating an optical system according to preceding calculating method;
- providing a lens blank with the selected customized base-curve;
- machining the rear surface according to the calculated optical system.

One aspect of the present invention relates to a computer program product comprising one or more stored sequence of instruction that is accessible to a processor and which, when executed by the processor, causes the processor to carry out at least one step of any of the preceding methods and/or to carry out the steps of any of the preceding methods.

Another aspect of the present invention relates to a computer readable medium carrying one or more sequences of instructions of the here above computer program product.

Unless specifically stated otherwise, as apparent from the following discussions, it is appreciated that throughout the specification discussions utilizing terms such as "computing", "calculating", "generating", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer or Digital Signal Processor ("DSP") selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMS) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

BRIEF DESCRIPTION OF THE DRAWINGS

Non limiting embodiments of the invention will now be described with reference to the accompanying drawings wherein.

DETAILED DESCRIPTION OF THE DRAWINGS

Elements in the figures are illustrated for simplicity and clarity and have not necessarily been drawn to scale. For example, the dimensions of some of the elements in the figure may be exaggerated relative to other elements to help improve the understanding of the embodiments of the present invention.

According to a first example of the present invention, a set of 12 base-curves of a base-curve series is provided.

The curvature values of the base-curves of this series increases from 1.25 D to 10.00 D according to following curvature values list: 1.25; 1.50; 1.75; 2.75; 3.75; 4.75; 5.25; 6.00; 6.75; 8.00; 9.00; 10.00.

The front surfaces of the semi-finished lens blanks corresponding to said base-curve series is spherical.

A target lens is calculated according to prescription data.

The design of the target lens is a PAL design. According to the present embodiment, the PAL design is a Varilux Comfort® design, commercialized by the company ESSILOR.

Figure 1:
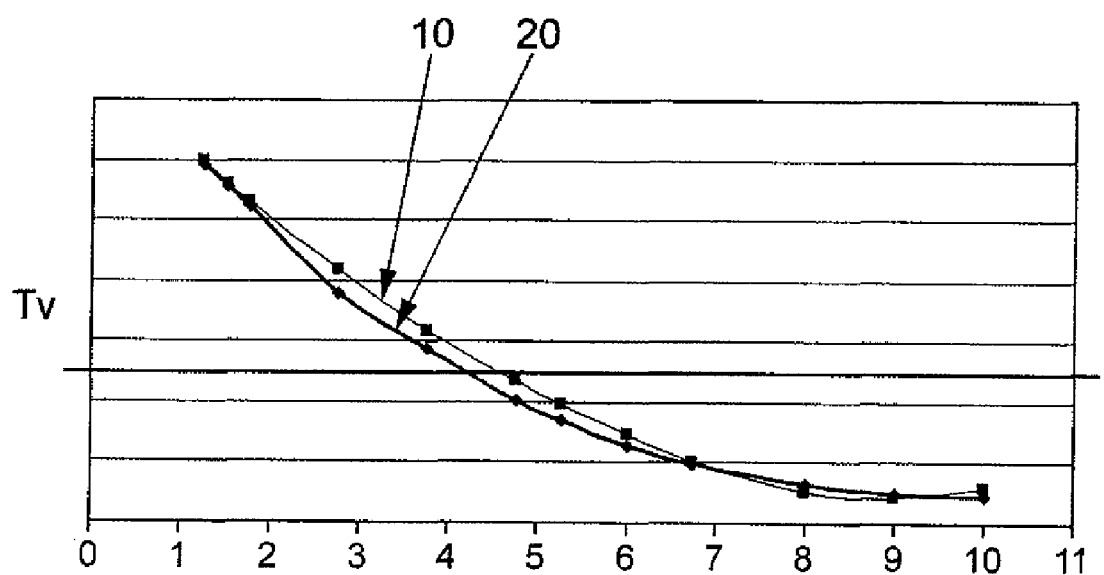
FIG. 1 shows a schematic view of differences of RMS values as a function of a base-curve series.

FIG. 1 shows a diagrammatic view of the differences of the Root mean square (RMS) values of two optical parameters between the 12 different base-curves calculated lenses of this series and the calculated target lens, as a function of the curvature of said base-curves (in diopter unit).

The curve referred as 10 (squares) illustrates the difference of the RMS values where the optical parameter is the dioptric power.

The curve referred as 20 (rhombuses) illustrates the difference of the RMS values where the optical parameter is the resulting astigmatism.

Both differences of RMS values are calculated in Diopter unit.

According to said embodiment the far distance zone dioptric power is 5.50 diopter and the addition dioptric power is 3.50 diopter.

A threshold value $T_v$ is represented as a line parallel to the abscissa axis.

According to the method of the invention, the list of base-curves of the base-curve series that may be used for customization consists of the base-curves where the difference for the selected parameter(s) is less or equal to the threshold value $T_v$. In the embodiment of FIG. 1, the list of selected base-curves is 4.75; 5.25; 6.00; 6.75; 8.00; 9.00; 10.00.

The inventors have discovered that choosing a threshold value $T_v$ less than 1.0 D is advantageous because they have observed that the optical quality of the final lens is satisfactory whenever the number of base-curves that can be used to manufacture the final lens is significantly increased.

The optical quality of the final lens may be slightly improved when limiting the threshold value to less or equal to 0.6 D, and even more preferably less or equal to 0.4 D.

The threshold value is preferably greater or equal than 0.2 D.

The same logic can apply to geometrical parameters such as for example thickness parameters. As for an example, a thickness parameter threshold value can be the percentage of maximum authorized thickening of the most cambered base-curve compared to the flattest base-curve. Said most cambered and flattest base-curves may be chosen in a pre-selected base-curve list, as for example the base-curve list resulting of FIG. 1. The final base-curve list is then shortened and takes into account both optical and geometrical parameters.

As for an example and for negative lenses, the percentage of maximum authorized thickening can be calculated on a diameter determined in relation to the maximum edge thickness, or in relation to an edge thickness in a given point, or in relation to the maximum edge thickness in a given zone, such as for example nasal zone or temporal zone.

As for an example, and for positive lenses, the percentage of maximum authorized thickening can be calculated in relation to the optical center or the PRP thickness.

It has to be noticed that a lens is commonly called a negative, respectively a positive, lens when its mean dioptric power is negative, respectively is positive.

As for an example, and depending of chosen aesthetic criteria the threshold value for a thickness parameter can be chosen as 10% to 30% of the maximum authorized thickening.

Figure 2:
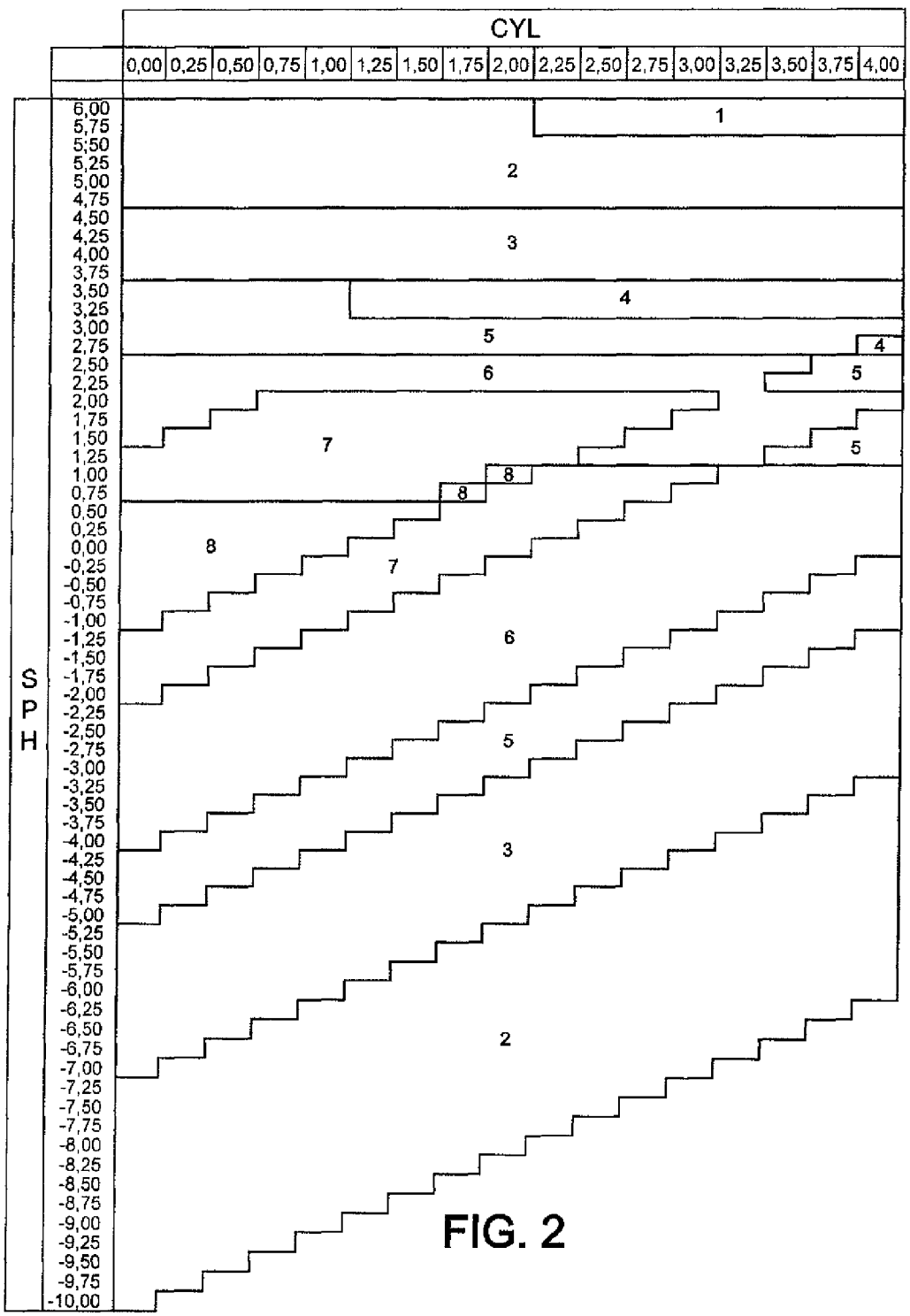
FIG. 2 shows a graph indicating the number of possible base-curves per prescription for a PAL, according to the present invention.

FIG. 2 shows a graph indicating the number of possible base-curves per prescription for a PAL according to the present invention, where the base-curves are chosen in the base-curve series of FIG. 1.

The selection results from the here above described method, where a first selected base-curves list has been obtained thanks to a threshold value of 0.4 D applied on both the difference of the RMS values of the dioptric power and the total astigmatism calculated on 60 mm diameter.

The final selected base-curves list is obtained from the first selected base-curves list and by applying a threshold value of 30% of the maximum authorized thickening on a 65 mm diameter (at the PRP for the positive lenses and at the maximum edge thickness for the negative lenses).

The number of resulting base-curves is indicated on FIG. 2 as a function of the spherical power (SPH) and cylindrical power (CYL) values of the prescription for the final lens, determined at the far vision point. As for an example a prescription is of SPH=−2 and CYL=1 leads to a list of 6 base-curves in the base-curve series.

Figure 3:
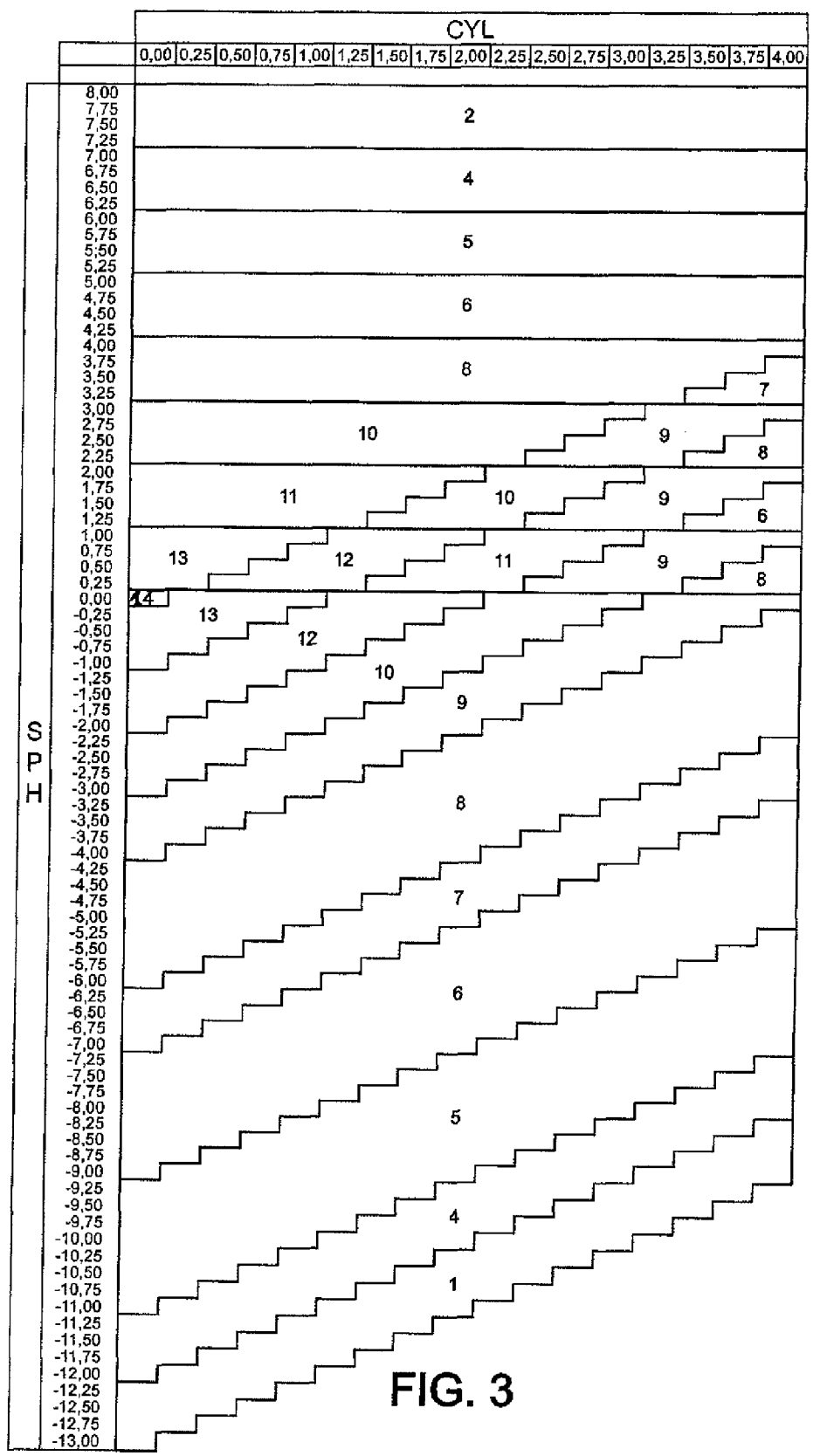
FIG. 3 shows graph indicating the number of possible base-curves per prescription for an aspherized single vision lens, according to the present invention.

Another example of graph indicating the number of possible base-curves is illustrated on FIG. 3, where the chosen design corresponds to this of an aspherized single vision lens.

The base-curve series consist of 14 curvature values increasing from 0.75 D to 8.50 D according to following curvature values list: 0.75; 1.00; 1.50; 2.00; 2.75; 3.25; 3.75; 4.25; 5.25; 5.75; 6.25; 6.50; 7.50; 8.50.

The front surfaces of the semi-finished lens blanks corresponding to said base-curve series is spherical. The selection results from the here above described method, where a first selected base-curves list has been obtained thanks to a threshold value of 0.3 D for the difference of RMS values of the dioptric power and a threshold value of 0.2 D for the difference of RMS values of the resulting astigmatism.

The final selected base-curves list is obtained from the first selected base-curves list and by applying a threshold value of 30% of the maximum authorized thickening on a 65 mm diameter at the optical center for the positive lenses and at the maximum edge thickness for the negative lenses.

The number of resulting base-curves per prescription is indicated on FIG. 3 as a function of the spherical power (SPH) and cylindrical power (CYL) values of the prescription for the final lens. As for an example a prescription of SPH=−2 and CYL=1 leads to a list of 10 base-curves in the base-curve series.

Providing a base-curves list according to a given base-curves series and a given prescription makes possible to take into account customization criteria and to select a "customized" base-curve. In the frame of the present invention, the wording "customized" base-curve is used to designate a base-curve chosen in a list of selected base-curves of a given base-curves series that fits the best a customization criteria.

According to an embodiment of the present invention a wearer may decide to choose a customized base-curve as a function of optimized optical performances, or minimal thickness, or lens curvature. He or she may like to take into account one or several of the customization criteria. As for an example, he or she may choose a preferred lens curvature in order to let the final lens fit with a chosen spectacle frame. When renewing optical equipment, he or she may also wish to keep a final lens design and curvature close to an older one.

Aesthetic criteria, such as minimal thickness, thickness at a given point or in a given zone, pairing criteria of the two lenses for a same spectacle lens, form criteria of the final lens according to a chosen frame, and several other criteria, can be thus taken into account.

According to an embodiment of the present invention, the wearer wishes to optimize optical performances of the final lens. A plurality of optical criteria may be chosen and their importance be taken into account according to a weighting metrics. Equation (1) is calculated:

$$C = \frac{p_1 C_1 + p_2 C_2 + \ldots, p_M C_M}{p_1 + p_2 + \ldots + p_M}; \quad (1)$$

where:
$p_i$ is the weighting coefficient of criterion i;
$C_i$ is the difference of the value for the criterion i between a base-curves calculated lenses and the target lens.
C is calculated for the selected base-curves calculated lenses of the different selected base-curves; the customized base-curve is the base-curve which value of C is the minimum in the list consisting of the C values for the selected base-curves.

As for an example C=(RMS_PO+RMS_AST)/2, where:

RMS_PO is the difference of the RMS values of the dioptric power between base-curves calculated lenses and the target lens;
RMS_AST is the difference of the RMS values of the resulting astigmatism between base-curves calculated lenses and the target lens.

If other customization criteria have to be taken into account, a list of base-curves where parameter C is equal or lower than a threshold value is provided.

It is then possible to help the choice of the base-curve for a given wearer taking into account for example 4 customization parameters: guaranteed optical performance, optimal optical performance, guaranteed thickness, optimal thickness.

Figure 4A:
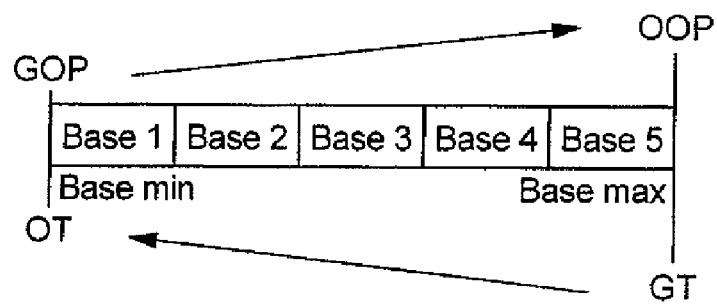
FIGS. 4a to 4c show charts which are helpful tools for customized base-curve selection, according to the present invention.

FIG. 4a illustrates the case where 5 base-curves, base 1 to base 5, fit the guaranteed optical performance and guaranteed thickness criteria. According to this figure the optical performance is increasing from base 1 to base 5 where the thickness decreases from base 5 to base 1. Such a chart is a helpful tool for base-curve selection.

Figure 4B:
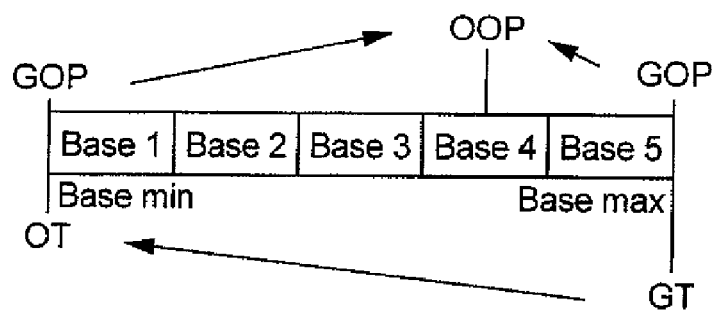

On FIGS. 4a to 4b, "GOP" means "guaranteed optical performance"; "OOP" means "optimal optical performance";

"OT" means "optimal thickness"; "GT" means "guaranteed thickness"; "OP" means "optical performance"; "Base min" corresponds to the base-curve of the selected list which curvature is minimal; "Base max" corresponds to the base-curve of the selected list which curvature is maximal.

FIG. 4b illustrates another case where 5 base-curves, base 1 to base 5, fit the guaranteed optical and guaranteed thickness criteria, but where the optimum optical performance is reached for base 4. Such a chart is also a helpful tool for base-curve selection.

According to another embodiment of the present invention, the wearer wishes to optimize one or several optical parameter(s) and one or several thickness parameter(s) of the final lens.

For each prescription, the rear face of the final lens will be aspherized so as the optical performances remain constant whatever is the chosen base-curve. Optical performances will be considered as equivalent if their values are different one from another less than a threshold value. As for an example, RMS_PO and RMS_AST determined on a 40 mm diameter will be considered as equivalent if they do not differ from more than 0.1 D.

Threshold values are provided for the thickness parameter (s) and the list of base-curves that respect these criteria is established.

The threshold values for the optical and/or thickness parameter(s) may be chosen with different values according to the zone of the lens to be considered or according to lens options, such as progression channel length, eye-head coefficient, wearing parameters.

Figure 4C:
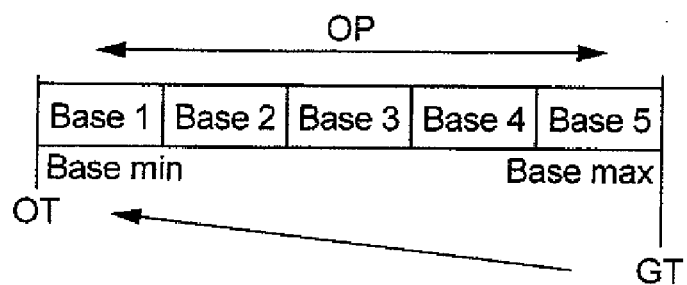

A selection chart for base-curve choice according to this embodiment is shown on FIG. 4c, where the optimum base-curve choice is made by taking into account a cambering value (such as a chosen frame cambering value) and thickness of the final lens.

According other embodiments of the present invention, the method for selecting a customized base-curve in the list of base-curves according to a customization criterion takes into account a given spectacle frame, comprises the steps of providing the spectacle frame front face base data and the customization criteria is choosing the base-curve which is the closest from the front base of the spectacle frame.

It will be thus understood that, on the contrary of the prior art approach, the chosen frame is an input data of the method, while the suitable lens is an output data.

The future wearer may choose the best looking frame and the lens provider is able to select a suitable suiting both the wearer prescription and the frame choice.

According to another aspect, the invention relates to a method of calculating an optical system (OS) of an ophthalmic lens according to a given spectacle frame comprising the steps of:
 providing wearer data,
 selecting a customized base-curve according to the method of selection of the invention,
 optimization of the optical system (OS) according to at least the criteria consisting of the wearer data, so as to generate at least a second optical surface different from the front surface of the ophthalmic lens.

According to further embodiments which can be considered alone or in combination:
 during the optimization step edging parameter are generated;
 before the optimization step the method further comprises a step of providing deformability data of the spectacle frame, and the optimization step further comprises a step of optimization of edging parameter according to at least the criteria consisting of the geometrical and deformability data of the spectacle lens and the wearer data;
 the geometrical data of the spectacle frame includes the curve $C_1$ in diopter of the front surface of a spectacle lens, the deformability data of the spectacle frame includes the deformability coefficient $C_d$ in diopter of the spectacle lens, the front surface base corresponds to a curve $C_1$ in diopter, and the edging parameter include at least a calculated bevel respecting: $|C_b-C_f| \leq C_d$, with $C_b$ the curve of the bevel in diopter;
 the bevel is calculated with respect to an edge of the spectacle lens according to a specified design mode and the curve of the bevel being;

$C_b=C_f$ when $|C_f-C_l| \leq C_d$ $C_b=C_f-C_d$ when $|C_f-C_l|>C_d$ and $C_f-C_l<0$ $C_b=C_f+C_d$ when $|C_f-C_l|>C_d$ and $C_f-C_l>0$;

before the optimization step the method further includes a step of providing an edging mode;
 the at least one generated optical surfaces is the rear surface of the ophthalmic lens;
 the at least one generated optical surfaces is a layer surface between the front and rear surface of the spectacle ophthalmic lens;
 the optimization criteria further comprises the index of refraction of the optical system (OS);
 the geometrical data are obtained by measuring a spectacle frame;
 the geometrical data are obtained from a spectacle frame data base;
 the geometrical data comprise contour parameters and a reference shape;
 the geometrical data comprise 3 dimensional data of the spectacle frame;
 the geometrical data comprise 2 dimensional data of the spectacle frame and curve data of the spectacle frame;
 the geometrical data comprises an internal contour data of the rim of the spectacle frame;
 the geometrical data of the spectacle lens further comprise geometrical data of the front face of the spectacle lens;
 the optimization criteria further comprises the thickness of the spectacle lens;
The optical system (OS) is identified by an optical function (OF), at least two optical surfaces comprise a first optical surface (S1) defined by a first equation (ES1) and a second surface (S2) defined by a second equation (ES2), the optimization step further comprises:
 a generating step (GEN), in which a virtual optical system (VOS) is used to generate a virtual function (VOF);
 a modification step (MOD), in which the virtual function (VOF) is modified so as obtain the function (OF);
 a calculation step (CAL), in which the second equation (ES2) is calculated from the function (OF), and the first equation (ES1).

In the present case, the first part (F1) corresponds to the front surface of the semi-finished lens blank corresponding to the customized base-curve, and defined by its equation (EF1).

The application WO 2007/017766 teaches how to implement such an optimization method.

According to another aspect, the invention relates to an ophthalmic lens manufacturing method comprising the steps of:
 receiving geometrical data of a spectacle frame,
 receiving an optical system (OS) of an ophthalmic lens data calculated using a method according to the invention, manufacturing the calculated ophthalmic lens.

The calculation can be done at the manufacturer side and the receiving can be an internal receiving.

According to further embodiments which can be considered alone or in combination:

the spectacle frame is selected at a lens order side and the geometrical data are transmitted to a computing device installed at a lens manufacturer side where the calculation steps are processed;

the spectacle frame is selected at a lens order side and after being manufactured at a lens manufacturer side, the ophthalmic lens is transmitted to the order side with edging parameters;

the spectacle frame is selected at a lens order side and after being manufactured at a lens manufacturer side, the ophthalmic lens is edged and the edged ophthalmic lens is sent to the order side;

the manufactured spectacle lens when edged is fitted in the selected spectacle frame;

The invention also relates to an ophthalmic lens ordering method comprising the steps of:

selecting a spectacle frame, ordering at a lens manufacturer an ophthalmic lens manufactured according to the invention, fitting the edged ophthalmic lens in the selected spectacle frame.

The ordering method may further comprise an edging step of the ophthalmic lens done at the order side.

The invention has been described above with the aid of an embodiment without limitation of the general inventive concept; in particular the optimization criteria are not limited to the examples discussed.

The invention claimed is:

1. A method for selecting base-curves for an ophthalmic lens according to given prescription data and to a chosen design, the method comprising the steps of:

providing a base-curve series according to the chosen design consisting of a plurality of base-curves, wherein the base-curved series is a series of semi-finished lens blanks that have front faces that increase incrementally in curvature;

providing a target lens according to the prescription data and to the chosen design;

calculating the base-curves calculated lenses according to the prescription data so as to calculate an optical system of a lens where the front face of the lens is the front face of the semi-finished lens blank corresponding to said base-curve and the rear face of the lens is optimized so as to fit the wearer's prescription;

providing, for at least an optical parameter and/or a geometrical parameter, a threshold value for the difference between the base-curves calculated lenses values and the target lens value of said parameter(s); and determining the list of the base-curves of the base-curve series where said difference for said parameter(s) is less or equal to the selected threshold value(s).

2. The method for selecting base-curves of claim 1, wherein the target lens is calculated with a front face according to Tscherning ellipses.

3. The method for selecting base-curves according to claim 1, wherein a selected parameter is an optical parameter chosen in the list comprising dioptric power, total astigmatism, resulting astigmatism.

4. The method for selecting base-curves according to claim 1, wherein the method for calculating the difference of a parameter value between the base-curves calculated lenses and the target lens is chosen in the list comprising root mean square differences, peak to valley differences, standard deviation, point to point differences.

5. The method for selecting base-curves according to claim 1, wherein a selected parameter is an optical parameter determined at a specific point or in a zone of the lens, as for an example a zone around the optical center or the prism reference point.

6. The method for selecting base-curves according to claim 1, wherein the lens is a progressive addition lens and a selected parameter is an optical parameter determined at a location chosen in the list comprising a zone of the far vision zone, a zone of the near vision zone, a zone of the intermediate vision zone, specific points of the far vision zone, near vision zone, intermediate vision zone, meridian line.

7. The method for selecting base-curves according to claim 3, wherein the difference of the values of the selected optical parameter is expressed using diopter units and where the threshold value is equal or less to 1 diopter, as for an example less or equal to 0.6 diopter or even less or equal to 0.4 diopter and/or greater to 0.2 diopter.

8. The method for selecting base-curves according to claim 1, wherein a selected parameter is a geometrical parameter which is a thickness value at a specific point or in a zone of the lens.

9. The method for selecting base-curves according to claim 1 which further includes a step of selecting a customized base-curve in the list of base-curve, wherein the customized base-curve is selected according to a customization criterion.

10. The method for selecting base-curves according to claim 9, wherein the customization criterion is selected in the list comprising thickness value of the final lens, front curvature of the final lens, optical performance of the final lens.

11. The method for selecting base-curves according to claim 10, wherein the curvature of the final lens is a customization criterion and is chosen as a function of a spectacle frame chosen by a wearer.

12. The method for selecting base-curves according to claim 10, wherein the curvature of the final lens is a customization criterion and is chosen according to a wearer's habits.

13. A method for calculating an optical system (OS) of an ophthalmic lens according to a given prescription comprising the steps of:

selecting a customized base-curve according to claim 9;

providing the front surface of the semi-finished lens blank corresponding to said base-curve as the front surface of the final lens; and calculating the rear surface of the final lens.

14. The method for calculating an optical system of an ophthalmic lens according claim 13, the optical system being identified by a function, the optical system comprising a first part corresponding to the front surface of the semi-finished lens blank defined by its equation and a second part defined by a second equation, the method comprising:

a generating step, in which a virtual optical system is used to generate a virtual function;

a modification step, in which the virtual function is modified so as obtain the function; and a calculation step, in which the second equation is calculated from the function, and the first equation.

15. A method of manufacturing an ophthalmic lens comprising the steps of:

calculating an optical system according to claim 13;

providing a lens blank with the selected customized base-curve; and machining the rear surface according to the calculated optical system.

16. A computer program product comprising one or more stored sequence of instruction that is accessible to a processor and which, when executed by the processor, causes the processor to carry out the steps of claim 1.

17. A computer readable medium carrying one or more sequences of instructions of the computer program product of claim 16.

18. The method for selecting base-curves according to claim 4, wherein the difference of the values of the selected optical parameter is expressed using diopter units and where the threshold value is equal or less to 1 diopter, as for an example less or equal to 0.6 diopter or even less or equal to 0.4 diopter and/or greater to 0.2 diopter.

19. The method for selecting base-curves according to claim 5, wherein the difference of the values of the selected optical parameter is expressed using diopter units and where the threshold value is equal or less to 1 diopter, as for an example less or equal to 0.6 diopter or even less or equal to 0.4 diopter and/or greater to 0.2 diopter.

20. The method for selecting base-curves according to claim 6, wherein the difference of the values of the selected optical parameter is expressed using diopter units and where the threshold value is equal or less to 1 diopter, as for an example less or equal to 0.6 diopter or even less or equal to 0.4 diopter and/or greater to 0.2 diopter.

21. A computer program product comprising one or more stored sequence of instruction that is accessible to a processor and which, when executed by the processor, causes the processor to carry out the steps of claim 13.

22. A computer program product comprising one or more stored sequence of instruction that is accessible to a processor and which, when executed by the processor, causes the processor to carry out the steps of claim 15.

23. A method for selecting base-curves for an ophthalmic lens accord to given prescription data and to a chosen design, the method comprising the steps of:
- providing a base-curve series according to the chosen design consisting of a plurality of base-curves, wherein the base-curve series is a series of semi-finished lens blanks that front faces increase incrementally in curvature;
- providing a target lens according to the prescription data and to the chosen design;
- calculating the base-curves calculated lenses according to the prescription data so as to calculate an optical system of a lens where the front face of the lens is the front face of the semi-finished lens blank corresponding to said base-curve and the rear face of the lens is optimized so as to fit the wearer's prescription;
- providing, for at least an optical parameter and/or a geometrical parameter, a threshold value for the difference between the base-curves calculated lenses values and the target lens value of said parameter(s); and
- determining the list of the base-curves of the base-curve series where said difference for said parameter(s) is less or equal to the selected threshold value(s),
- wherein the method for calculating the different of a parameter value between the base-curves calculated lenses and the target lens is chosen in the list comprising root mean square (RMS) differences, peak to valley (PV) differences, standard deviation, point to point differences.

* * * * *